United States Patent
Kong et al.

(10) Patent No.: US 9,418,867 B2
(45) Date of Patent: Aug. 16, 2016

(54) MASK PASSIVATION USING PLASMA

(71) Applicant: Applied Materials, Inc., Santa Clara, CA (US)

(72) Inventors: Byungkook Kong, San Ramon, CA (US); Hung Sang Kim, San Ramon, CA (US); Hoon Sang Lee, Hwasung (KR); Jeong Hyun Yoo, Gyeonggi-do (KR); Jun-Wan Kim, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 85 days.

(21) Appl. No.: 14/152,982

(22) Filed: Jan. 10, 2014

(65) Prior Publication Data

US 2015/0200109 A1     Jul. 16, 2015

(51) Int. Cl.
*H01L 21/311*   (2006.01)
*H01L 21/02*    (2006.01)
*H01L 21/308*   (2006.01)
*H01L 21/3213*  (2006.01)
*H01L 21/30*    (2006.01)

(52) U.S. Cl.
CPC .... *H01L 21/31144* (2013.01); *H01L 21/02118* (2013.01); *H01L 21/02274* (2013.01); *H01L 21/3086* (2013.01); *H01L 21/31122* (2013.01); *H01L 21/32139* (2013.01); *H01L 21/3003* (2013.01)

(58) Field of Classification Search
CPC .................................................. H01L 21/3003
USPC .......................................... 438/475, 950, 958
See application file for complete search history.

(56) References Cited

U.S. PATENT DOCUMENTS

| | | | |
|---|---|---|---|
| 6,939,794 B2 | 9/2005 | Yin et al. | |
| 2007/0123050 A1* | 5/2007 | Zhou ................ | H01L 21/31116 438/706 |
| 2013/0109188 A1 | 5/2013 | Kim et al. | |
| 2015/0041192 A1* | 2/2015 | Han ...................... | H05K 3/108 174/257 |

FOREIGN PATENT DOCUMENTS

| | | |
|---|---|---|
| EP | 1611603 A1 | 1/2006 |
| WO | WO2004034445 B1 | 4/2004 |
| WO | WO2004093176 A1 | 10/2004 |
| WO | WO2010047976 A2 | 4/2010 |
| WO | WO2010047978 A3 | 4/2010 |

* cited by examiner

*Primary Examiner* — Chandra Chaudhari
(74) *Attorney, Agent, or Firm* — Blakely Sokoloff Taylor & Zafman LLP (57) ABSTRACT

A gas comprising hydrogen is supplied to a plasma source. Plasma comprising hydrogen plasma particles is generated from the gas. A passivation layer is deposited on a first mask layer on a second mask layer over a substrate using the hydrogen plasma particles.

12 Claims, 6 Drawing Sheets

MASK PASSIVATION USING PLASMA

FIELD

Embodiments of the present invention pertain to the field of electronic device manufacturing, and in particular, to mask passivation.

BACKGROUND

In the semiconductor industry a number of manufacturing processes are typically used to produce electronic devices of an ever-decreasing size. Some manufacturing processes involve etching dielectric films using a mask layer. Generally, double patterning refers to a class of technologies for manufacturing integrated circuits (ICs), developed for photolithography to enhance the feature density. In the double patterning technology, the conventional lithography process is enhanced to produce double the expected number of features.

Currently, an amorphous carbon layer ("ACL") is used as a hard mask for patterning, for example, shallow trench isolation, gate, bitline, contact, capacitor, interconnect, and other features for electronic devices. The ACL is also used as a hard mask for the double patterning integration into the lithography at 193 nanometers ("ArF lithography"). As device feature sizes are getting smaller, critical dimensions ("CDs") become smaller and etch depth is getting greater. Accordingly, high ion energy are used to etch high aspect ratio features.

For high aspect ratio features of the electronic devices, the thickness of the ACL hard mask needs to be increased to withstand etch of the underlying layers. Increasing the thickness of the ACL, however, can create etching defects, for example striation, wiggling, or other defects of the etched features. Additionally, increasing the thickness of the ACL increases opacity of the mask. Increasing the opacity of the mask makes it difficult to align the mask to a wafer for lithography. Moreover, the double patterned masks, for example, an oxide mask on the ACL, tend to shrink and collapse during a reactive ion etch.

SUMMARY

Methods and apparatuses to provide mask passivation using plasma are described. In one embodiment, a gas comprising hydrogen is supplied to a plasma source. Plasma comprising hydrogen plasma particles is generated from the gas. A passivation layer is deposited on a first mask layer on a second mask layer over a substrate using the hydrogen plasma particles.

In one embodiment, a gas comprising hydrogen is supplied to a plasma source. Plasma comprising hydrogen plasma particles is generated from the gas. A passivation layer is deposited on a first mask layer on a second mask layer over a substrate using the hydrogen plasma particles. The passivation layer comprises a polymer layer formed by bonding the hydrogen particles to the first mask layer.

In one embodiment, a gas comprising hydrogen is supplied to a plasma source. Plasma comprising hydrogen plasma particles is generated from the gas. A passivation layer is deposited on a first mask layer on a second mask layer over a substrate using the hydrogen plasma particles. The gas comprising hydrogen is $H_2$, $CH_4$, HBr, other hydrogen containing gas, or any combination thereof.

In one embodiment, a gas comprising hydrogen is supplied to a plasma source. Plasma comprising hydrogen plasma particles is generated from the gas. A passivation layer is deposited on a first mask layer on a second mask layer over a substrate using the hydrogen plasma particles. The second mask layer comprises a boron doped amorphous carbon layer.

In one embodiment, a first amorphous carbon layer is deposited on a second mask layer over a substrate. A hard mask layer is deposited on the first amorphous carbon layer. The hard mask layer is patterned. The first amorphous carbon layer is patterned. A first mask layer is formed comprising the patterned hard mask layer on the patterned first amorphous layer. A gas comprising hydrogen is supplied to a plasma source. Plasma comprising hydrogen plasma particles is generated from the gas. A passivation layer is deposited on the first mask layer using the hydrogen plasma particles.

In one embodiment, a gas comprising hydrogen is supplied to a plasma source. Plasma comprising hydrogen plasma particles is generated from the gas. A passivation layer is deposited on a first mask layer on a second mask layer over a substrate using the hydrogen plasma particles. The second mask layer is etched through the passivated first mask layer.

In one embodiment, a gas comprising hydrogen is supplied to a plasma source. Plasma comprising hydrogen plasma particles is generated from the gas. A passivation layer is deposited on a first mask layer on a second mask layer over a substrate using the hydrogen plasma particles. At least one of a first pressure, a first source power, a first bias power, a first gas flow, or a first temperature is adjusted to deposit the passivation layer.

In one embodiment, a passivation layer is deposited on a first mask layer on a boron doped carbon layer over a substrate using plasma comprising hydrogen plasma particles. The boron doped carbon layer is etched through the passivated first mask layer.

In one embodiment, a passivation layer is deposited on a first mask layer on a boron doped carbon layer over a substrate using plasma comprising hydrogen plasma particles. The boron doped carbon layer is etched through the passivated first mask layer. The passivation layer comprises a polymer layer formed by bonding the hydrogen particles to carbon of the first mask layer.

In one embodiment, a passivation layer is deposited on a first mask layer on a boron doped carbon layer over a substrate using plasma comprising hydrogen plasma particles. The boron doped carbon layer is etched through the passivated first mask layer. The plasma is generated using a gas comprising H2, CH4, HBr, other hydrogen containing gas, or any combination thereof.

In one embodiment, a passivation layer is deposited on a first mask layer on a boron doped carbon layer over a substrate using plasma comprising hydrogen plasma particles. The boron doped carbon layer is etched through the passivated first mask layer. The first mask layer comprises a hard mask layer on a first amorphous carbon layer.

In one embodiment, a passivation layer is deposited on a first mask layer on a boron doped carbon layer over a substrate using plasma comprising hydrogen plasma particles. The boron doped carbon layer is etched through the passivated first mask layer. The boron doped carbon layer is etched through the passivated first mask layer using plasma comprising a fluorine, chlorine, or a combination thereof chemistries.

In one embodiment, a passivation layer is deposited on a first mask layer on a boron doped carbon layer over a substrate using plasma comprising hydrogen plasma particles. The boron doped carbon layer is etched through the passivated first mask layer. At least one of a first pressure, a first source power, a first bias power, a first gas flow, or a first temperature is adjusted to deposit the passivation layer.

In one embodiment, a passivation layer is deposited on a first mask layer on a boron doped carbon layer over a substrate using plasma comprising hydrogen plasma particles. The boron doped carbon layer is etched through the passivated first mask layer. At least one of a second pressure, a second source power, a second bias power, a second gas flow, or a second temperature is adjusted to etch the boron doped carbon layer.

In one embodiment, an apparatus to manufacture an electronic device comprises a processing chamber comprising a pedestal to hold a workpiece comprising a first mask layer on a second mask layer over a substrate. A plasma source coupled to the processing chamber to receive a gas comprising hydrogen and to generate plasma comprising hydrogen particles from the gas. A processor coupled to the plasma source. The processor has a first configuration to control depositing a passivation layer on the first mask layer using the hydrogen plasma particles.

In one embodiment, an apparatus to manufacture an electronic device comprises a processing chamber comprising a pedestal to hold a workpiece comprising a first mask layer on a second mask layer over a substrate. A plasma source coupled to the processing chamber to receive a gas comprising hydrogen and to generate plasma comprising hydrogen particles from the gas. A processor coupled to the plasma source. The processor has a first configuration to control depositing a passivation layer on the first mask layer using the hydrogen plasma particles. The passivation layer comprises a polymer layer formed by bonding the hydrogen particles to carbon of the first mask layer.

In one embodiment, an apparatus to manufacture an electronic device comprises a processing chamber comprising a pedestal to hold a workpiece comprising a first mask layer on a second mask layer over a substrate. A plasma source coupled to the processing chamber to receive a gas comprising hydrogen and to generate plasma comprising hydrogen particles from the gas. The gas comprising hydrogen is $H_2$, $CH_4$, HBr, other hydrogen containing gas, or any combination thereof. A processor coupled to the plasma source. The processor has a first configuration to control depositing a passivation layer on the first mask layer using the hydrogen plasma particles.

In one embodiment, an apparatus to manufacture an electronic device comprises a processing chamber comprising a pedestal to hold a workpiece comprising a first mask layer on a second mask layer over a substrate. A plasma source coupled to the processing chamber to receive a gas comprising hydrogen and to generate plasma comprising hydrogen particles from the gas. A processor coupled to the plasma source. The processor has a first configuration to control depositing a passivation layer on the first mask layer using the hydrogen plasma particles. The second mask layer comprises a boron doped amorphous carbon layer.

In one embodiment, an apparatus to manufacture an electronic device comprises a processing chamber comprising a pedestal to hold a workpiece comprising a first mask layer on a second mask layer over a substrate. A plasma source coupled to the processing chamber to receive a gas comprising hydrogen and to generate plasma comprising hydrogen particles from the gas. A processor coupled to the plasma source. The processor has a first configuration to control depositing a passivation layer on the first mask layer using the hydrogen plasma particles. The processor has a second configuration to control etching the second mask layer through the passivated first mask layer.

In one embodiment, an apparatus to manufacture an electronic device comprises a processing chamber comprising a pedestal to hold a workpiece comprising a first mask layer on a second mask layer over a substrate. A plasma source coupled to the processing chamber to receive a gas comprising hydrogen and to generate plasma comprising hydrogen particles from the gas. A processor coupled to the plasma source. The processor has a first configuration to control depositing a passivation layer on the first mask layer using the hydrogen plasma particles. The first mask layer comprises a patterned hard mask layer on a patterned first amorphous carbon layer. The processor has a third configuration to control depositing of the first amorphous carbon layer on the second mask layer. The processor has a fourth configuration to control depositing of the hard mask layer on the first amorphous carbon layer. The processor has a fifth configuration to control patterning the hard mask layer. The processor has a sixth configuration to control patterning the first amorphous carbon layer to form the first mask layer.

In one embodiment, an apparatus to manufacture an electronic device comprises a processing chamber comprising a pedestal to hold a workpiece comprising a first mask layer on a second mask layer over a substrate. A plasma source coupled to the processing chamber to receive a gas comprising hydrogen and to generate plasma comprising hydrogen particles from the gas. A processor coupled to the plasma source. The processor has a first configuration to control depositing a passivation layer on the first mask layer using the hydrogen plasma particles. A memory is coupled to the processor to store one or more parameters comprising at least one of a pressure, a source power, a bias power, a gas flow, or a temperature.

Other features of the present invention will be apparent from the accompanying drawings and from the detailed description which follows.

BRIEF DESCRIPTION OF THE DRAWINGS

The embodiments as described herein are illustrated by way of example and not limitation in the figures of the accompanying drawings in which like references indicate similar elements.

DETAILED DESCRIPTION

In the following description, numerous specific details, such as specific materials, chemistries, dimensions of the elements, etc. are set forth in order to provide thorough understanding of one or more of the embodiments of the present invention. It will be apparent, however, to one of ordinary skill in the art that the one or more embodiments of the present invention may be practiced without these specific details. In other instances, semiconductor fabrication processes, techniques, materials, equipment, etc., have not been described in great details to avoid unnecessarily obscuring of this description. Those of ordinary skill in the art, with the included description, will be able to implement appropriate functionality without undue experimentation.

While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment of this invention. While the invention has been described in terms of several embodiments, those skilled in the art will recognize that the invention is not limited to the embodiments described, but can be practiced with modification and alteration within the spirit and scope of the appended claims. The description is thus to be regarded as illustrative rather than limiting.

Methods and apparatuses to provide mask passivation using plasma are described. In one embodiment, a gas comprising hydrogen is supplied to a plasma source. Plasma comprising hydrogen plasma particles is generated from the gas. A passivation layer is deposited on a first mask layer on a second mask layer over a substrate using the hydrogen plasma particles.

In an embodiment, to increase mask selectivity, a deposition mode is used in a plasma chamber that generates plasma from hydrogen containing gases. In the deposition mode, the hydrogen plasma particles are attached to the mask to form a passivation layer that prevents the mask's loss during etching of the underlying layers. In an embodiment, the deposition mode using hydrogen containing gases plasma for example, $H_2$, $CH_4$, HBr, or any combination thereof for mask protection is followed by a boron doped ACL etch using high energy ions having fluorine, chlorine, or a combination thereof chemistries.

As the critical dimensions ("CDs") of the electronic device features are getting smaller for example, less than 20-40 nm, a boron doped amorphous carbon layer ("BACL") is being developed as a hard mask for patterning. The transparency of the BACL for the ArF lithography is substantially greater than that of the conventional ACL. The selectivity of the BACL for etching of the underlining dielectric layers is also substantially greater than that of the conventional ACL. Typically, the plasma etching with high bias power and fluorine, chlorine, or a combination thereof based chemistries are used to the dielectic features having high aspect ratios of depth to width, for example, the aspect ratios of depth to width greater than 10:1. The etch regime of high ion bombardment, however, may deteriorate the mask's selectivity.

Comparing with conventional etching techniques, embodiments as described herein provide an advantage of effectively preserving the mask while etching an underlying boron doped amorphous carbon layer ("BACL") using plasma without the need to increase the mask thickness. In an embodiment, a passivation of the mask using plasma generated from a hydrogen containing gas, for example, $H_2$, $CH_4$, HBr, or any combination thereof advantageously increases selectivity of the mask while providing highly anisotropic etching of an underlying BACL. In an embodiment, deposition of a passivation layer on a mask using hydrogen plasma particles increases the mask selectivity for etching of an underlying BACL using high energy ions having fluorine, chlorine, or both chemistries from about 3:1 to about 9:1. In an embodiment, deposition of a passivation layer on a mask using hydrogen plasma particles provides an advantage of decreasing the CD of the etched device features without pattern collapse.

Generally, double patterning lithography decomposes and prints the shapes of a layout in two exposures. In double patterning lithography, adjacent identical layout features can have distinct mean CDs, and uncorrelated CD variations referred as bimodal CDs.

In an embodiment, deposition of a passivation layer on a mask using hydrogen plasma particles advantageously minimizes the bimodal CD originated from the double patterning.

Figure 1:
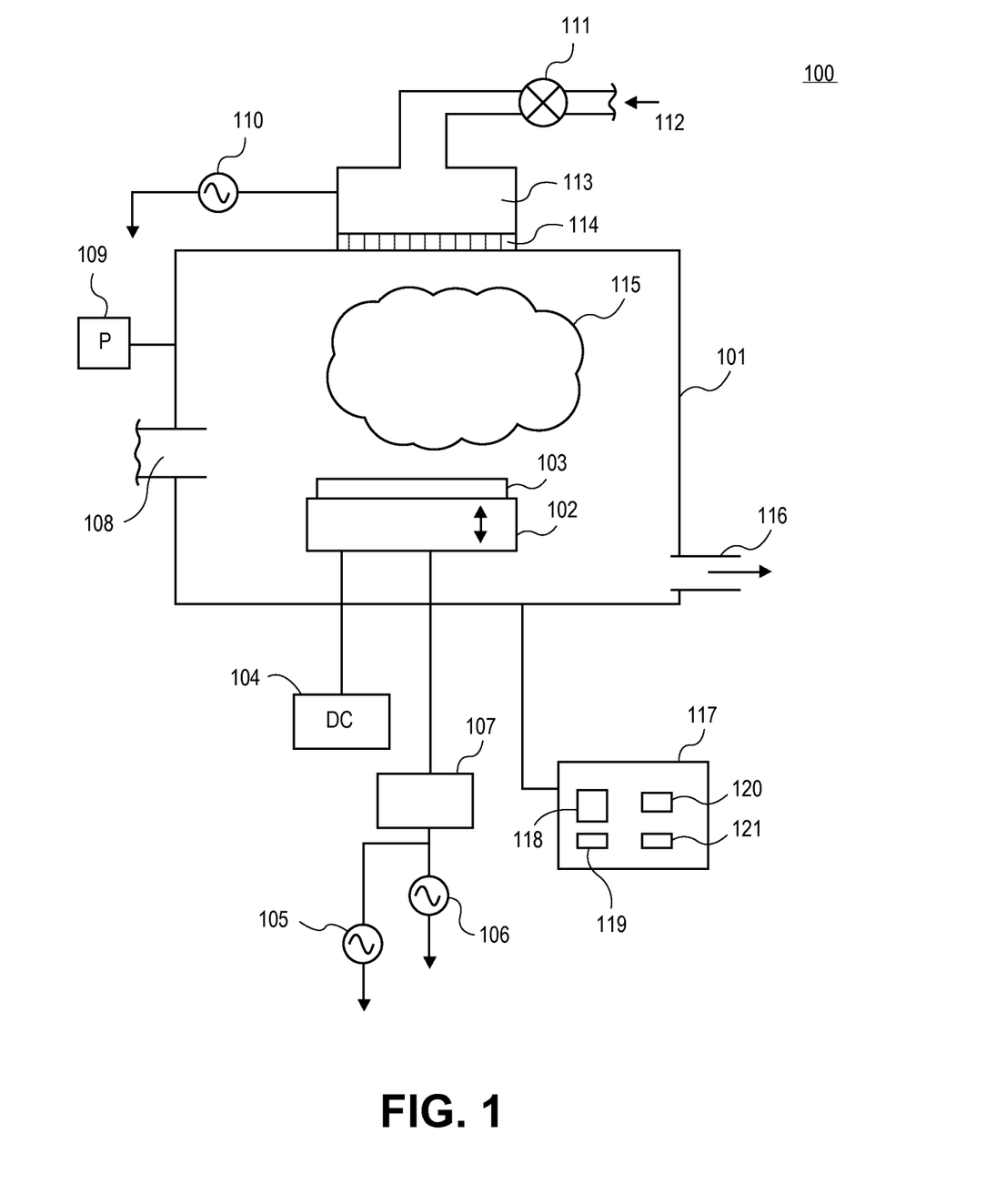
FIG. 1 shows a block diagram of one embodiment of a plasma system to provide mask passivation.

FIG. 1 shows a block diagram of one embodiment of a plasma system 100 to provide mask passivation. As shown in FIG. 1, system 100 has a processing chamber 101. A movable pedestal 102 to hold a workpiece 103 is placed in processing chamber 101. Pedestal 102 comprises an electrostatic chuck ("ESC"), a DC electrode embedded into the ESC, and a cooling/heating base. In an embodiment, pedestal 102 acts as a moving cathode. In an embodiment, the ESC comprises an $Al_2O_3$ material, $Y_2O_3$, or other ceramic materials known to one of ordinary skill of electronic device manufacturing. A DC power supply 104 is connected to the DC electrode of the pedestal 102.

As shown in FIG. 1, a workpiece 103 is loaded through an opening 108 and placed on the pedestal 102. In an embodiment, the workpiece comprises a first mask layer on a second mask layer over a substrate. In an embodiment, the first mask layer comprises a patterned hard mask layer, as described in further detail below with respect to FIGS. 2A-2M. The workpiece can comprise a mask on a semiconductor wafer, or can be other workpiece known to one of ordinary skill in the art of electronic device manufacturing. In at least some embodiments, the workpiece comprises any material to make any of integrated circuits, passive (e.g., capacitors, inductors) and active (e.g., transistors, photo detectors, lasers, diodes) microelectronic devices. The workpiece may include insulating (e.g., dielectric) materials that separate such active and passive microelectronic devices from a conducting layer or layers that are formed on top of them. In one embodiment, the workpiece comprises a mask over a semiconductor substrate that includes one or more dielectric layers e.g., silicon dioxide, silicon nitride, sapphire, and other dielectric materials. In one embodiment, the workpiece comprises a mask over a wafer stack including one or more layers. The one or more layers of the workpiece can include conducting, semiconducting, insulating, or any combination thereof layers.

System 100 comprises an inlet to input one or more process gases 112 through a mass flow controller 111 to a plasma source 113. A plasma source 113 comprising a showerhead 114 is coupled to the processing chamber 101 to receive one or more gases 112 comprising hydrogen and to generate plasma comprising hydrogen particles from the gases. In an embodiment, one or more process gases 112 are $H_2$, $CH_4$, HBr, other hydrogen containing gas, or any combination thereof that are used to generate hydrogen plasma particles to attach to the features of the first mask layer to form a passivation layer on the features of the first mask layer, as described in further detail below.

In an embodiment, one or more process gases 112 comprise fluorine, chlorine, other etch chemistries, or any combination thereof to etch the second mask layer and underlying layers over the substrate through the passivated features of the first mask layer, as described in further detail below.

Plasma source 113 is coupled to a RF source power 110. Plasma source 113 through showerhead 114 generates a plasma 115 in processing chamber 101 from one or more process gases 111 using a high frequency electric field. Plasma 115 comprises plasma particles, such as ions, electrons, radicals, or any combination thereof.

In an embodiment, power source 110 supplies power from about 100 W to about 3000 W at a frequency from about 13.56 MHz to about 162 MHz to generate plasma 115.

A plasma bias power 105 is coupled to the pedestal 102 (e.g., cathode) via a RF match 107 to energize the plasma. In an embodiment, the plasma bias power 105 provides a bias power that is not greater than 1000 W at a frequency between about 2 MHz to 60 MHz, and in a particular embodiment at about 13 MHz. A plasma bias power 106 may also be provided, for example to provide another bias power that is not greater than 1000 W at a frequency from about 2 MHz to about 60 MHz, and in a particular embodiment, at about 60 MHz. Plasma bias power 106 and bias power 105 are connected to RF match 107 to provide a dual frequency bias power. In an embodiment, a total bias power applied to the pedestal 102 is from about 10 W to about 3000 W.

As shown in FIG. 1, a pressure control system 109 provides a pressure to processing chamber 101. As shown in FIG. 1, chamber 101 is evacuated via one or more exhaust outlets 116 to evacuate volatile products produced during processing in the chamber. In an embodiment, the plasma system 100 is an inductively coupled plasma ("ICP") system. In an embodiment, the plasma system 100 is a capacitively coupled plasma ("CCP") system.

A control system 117 is coupled to the chamber 101. The control system 117 comprises a processor 118, a temperature controller 119 coupled to the processor 1118, a memory 120 coupled to the processor 118, and input/output devices 125 coupled to the processor 118.

In an embodiment, processor 118 has a first configuration to control depositing a passivation layer on the first mask layer using the hydrogen plasma particles. The passivation layer comprises a polymer layer formed by bonding the hydrogen plasma particles to carbon of the first mask layer, as described in further detail below. The processor 118 has a second configuration to control etching of the second mask layer through the passivated first mask layer, as described in further detail below.

In an embodiment, the first mask layer comprises a hard mask layer on a first amorphous carbon layer. In an embodiment, processor 123 has a third configuration to control depositing of the first amorphous carbon layer on the second mask layer. In an embodiment, processor 123 has a fourth configuration to control depositing of the hard mask layer on the first amorphous carbon layer. The processor 123 has a fifth configuration to control patterning of the hard mask layer. The processor 123 has a sixth configuration to control patterning of the first amorphous carbon layer to form the first mask layer. In an embodiment, memory 120 stores one or more parameters comprising at least one of a pressure, a source power, a bias power, a gas flow, or a temperature to control deposition of the passivation layer on the features of the first mask layer, and to control etching of the underlying second mask layer, and to control etching other layers underlying the second mask layer through the passivated features of the first mask layer.

The control system 117 is configured to perform methods as described herein and may be either software or hardware or a combination of both.

The plasma system 100 may be any type of high performance semiconductor processing plasma systems known in the art, such as but not limited to an etcher, a cleaner, a furnace, or any other plasma system to manufacture electronic devices. In an embodiment, the system 100 may represent one of the plasma systems e.g., AVATAR, AdvantEdge Mesa systems manufactured by Applied Materials, Inc. located in Santa Clara, Calif., or any other plasma system.

Figure 2A:
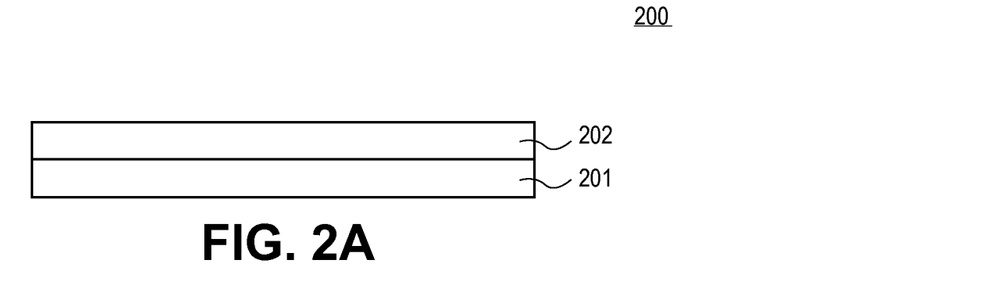
FIG. 2A shows a side view of an electronic device structure according to one embodiment.

FIG. 2A shows a side view of an electronic device structure 200 according to one embodiment. Electronic device structure 200 comprises a substrate. In an embodiment, electronic device structure 200 represents workpiece 103 depicted in FIG. 1. In an embodiment, substrate 201 includes a semiconductor material, e.g., monocrystalline silicon ("Si"), germanium ("Ge"), silicon germanium ("SiGe"), a III-V materials based material e.g., gallium arsenide ("GaAs"), or any combination thereof. In one embodiment, substrate 201 includes metallization interconnect layers for integrated circuits. In one embodiment, substrate 201 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In at least some embodiments, substrate 201 includes interconnects, for example, vias, configured to connect the metallization layers. In one embodiment, substrate 201 is a semiconductor-on-isolator (SOI) substrate including a bulk lower substrate, a middle insulation layer, and a top monocrystalline layer. The top monocrystalline layer may comprise any material listed above, e.g., silicon.

A device layer 202 is deposited on substrate 201. In an embodiment, device layer 202 is an insulating layer suitable to insulate adjacent devices and prevent leakage. In one embodiment, device layer 202 is an oxide layer, e.g., silicon oxide, aluminum oxide ("Al2O3"), silicon oxide nitride ("SiON"), a silicon nitride layer, any combination thereof, or other electrically insulating layer determined by an electronic device design. In one embodiment, device layer 202 comprises an interlayer dielectric (ILD), e.g., silicon dioxide. In one embodiment, device layer 202 includes polyimide, epoxy, photodefinable materials, such as benzocyclobutene (BCB), and WPR-series materials, or spin-on-glass.

In an embodiment, device layer 202 is a conductive layer. In an embodiment, device layer 202 comprises a metal, for example, copper (Cu), aluminum (Al), indium (In), tin (Sn), lead (Pb), silver (Ag), antimony (Sb), bismuth (Bi), zinc (Zn), cadmium (Cd), gold (Au), ruthenium (Ru), nickel (Ni), cobalt (Co), chromium (Cr), iron (Fe), manganese (Mn), titanium (Ti), hafnium (Hf), tantalum (Ta), tungsten (W), vanadium (V), molybdenum (Mo), palladium (Pd), gold (Au), platinum (Pt), polysilicon, other conductive layer known to one of ordinary skill in the art of electronic device manufacturing, or any combination thereof. In an embodiment, device layer 202 is a stack of one or more layers described above.

Device layer 202 can be deposited using one of a deposition techniques, such as but not limited to a chemical vapour deposition ("CVD"), e.g., a Plasma Enhanced Chemical Vapour Deposition (VEEN/DM a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing.

Figure 2B:
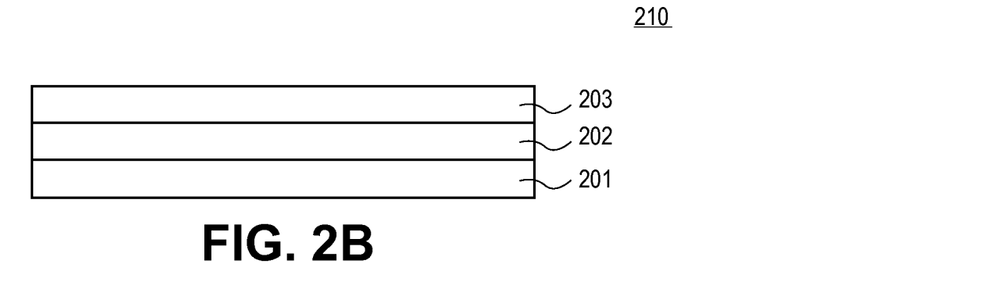
FIG. 2B is a view similar to FIG. 2A after a lower mask layer is deposited on a device layer over a substrate according to one embodiment.

In an embodiment, the thickness of the device layer 202 is from about 2 nanometers ("nm") to about 5 micron (µm"). In more specific embodiment, the thickness of the device layer 202 is from about 25 nm to about 100 nm. FIG. 2B is a view 210 similar to FIG. 2A after a lower mask layer 203 is deposited on a device layer 202 over substrate 201 according to one embodiment. In an embodiment, mask layer 203 is an organic hard mask layer comprising carbon. In an embodiment, mask layer 203 is an amorphous carbon layer doped with a chemical element (e.g., boron, silicon, aluminum, gallium, indium, or other chemical element) to act as a hard mask to etch the underlying device layer 202. In an embodiment, mask layer 203 is a boron doped amorphous carbon layer ("BACL"). In an embodiment, the atomic percentage of boron in the BACL layer is from about 20% to about 50%. In an embodiment, mask layer 203 is a BACL Saphira layer manufactured by Applied Materials, Inc. located in Santa Clara, Calif., or other BACL. In an embodiment, the thickness of the mask layer 203 is from about 2 nm to about 5 µm. In more specific embodiment, the thickness of the mask layer 203 is from about 2 nm to about 100 nm. In even more specific embodiment, the thickness of the mask layer 203 is about 80 nm. Mask layer 203 can be deposited using one of a deposition techniques, such as but not limited to a chemical vapour deposition ("CVD"), e.g., a Plasma Enhanced Chemical Vapour Deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing.

Figure 2C:
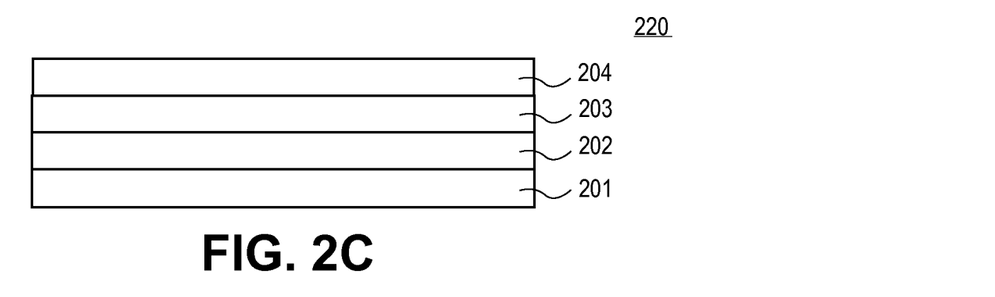
FIG. 2C is a view similar to FIG. 2B after an upper mask layer is deposited on the lower mask layer according to one embodiment.

FIG. 2C is a view 220 similar to FIG. 2B after an upper mask layer 204 is deposited on mask layer 203 according to one embodiment. In an embodiment, mask layer 204 is an organic hard mask layer comprising carbon. In an embodiment, the selectivity of the mask layer 204 to etch of the underlying layer 202 is less than that of mask layer 203. In an embodiment, mask layer 204 is an amorphous carbon layer ("ACL") deposited on hard mask layer 203 of BACL to etch the underlying device layer 202. In an embodiment, the thickness of the mask layer 204 is from about 2 nm to about 5 µm. In more specific embodiment, the thickness of the mask layer is from about 5 nm to about 200 nm. Mask layer 204 can be deposited using one of a deposition techniques, such as but not limited to a chemical vapor deposition ("CVD"), e.g., a Plasma Enhanced Chemical Vapor Deposition ("PECVD"), a physical vapor deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing.

Figure 2D:
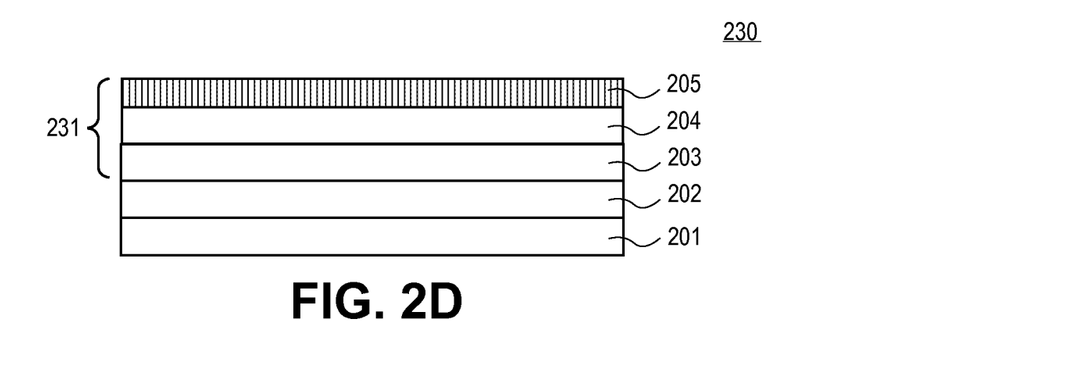
FIG. 2D is a view similar to FIG. 2C after a top hard mask layer is deposited on the upper mask layer according to one embodiment.

FIG. 2D is a view similar to FIG. 2C after a top hard mask layer 205 is deposited on mask layer 204 according to one embodiment. A composite mask layer 231 comprises hard mask layer 205 on mask layer 204 on mask layer 203, as shown in FIG. 2D. In an embodiment, hard mask layer 205 is an oxide, silicon oxide nitride ("SiON"), or a combination thereof hard mask. In an embodiment, hard mask layer 205 comprises an aluminum oxide (e.g., $Al_2O_3$); polysilicon, amorphous Silicon, poly germanium ("Ge"), a refractory metal (e.g., tungsten ("W"), molybdenum ("Mo"), other refractory metal, or any combination thereof. In an embodiment, hard mask layer 205 is deposited on mask layer 204 to form a mask for a double patterning technology.

In an embodiment, the thickness of the hard mask layer 205 is from about 2 nm to about 5 µm. In more specific embodiment, the thickness of the mask layer is from about 5 nm to about 200 nm. Mask layer 204 can be deposited using one of a deposition techniques, such as but not limited to a chemical vapor deposition ("CVD"), e.g., a Plasma Enhanced Chemical Vapour Deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing.

Figure 2E:
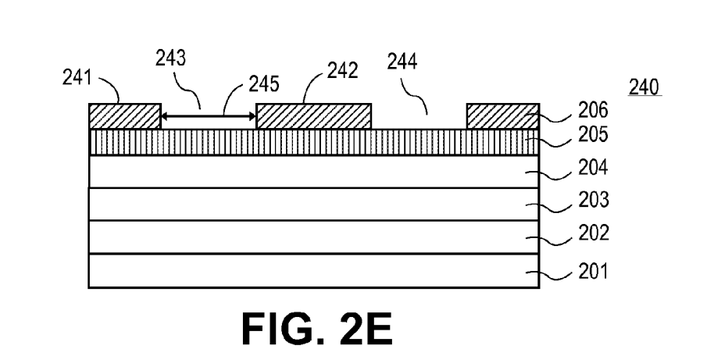
FIG. 2E is a view similar to FIG. 2D after a patterned photoresist layer is deposited on the top hard mask layer according to one embodiment.

FIG. 2E is a view 240 similar to FIG. 2D after a patterned photoresist layer 206 is deposited on hard mask layer 205 according to one embodiment. The patterned photoresist layer 206 has a plurality of features, such as a feature 241 and a feature 242 spaced apart from each other to expose portions 243 and 244 of the hard mask layer. In an embodiment, a distance 245 between the features 241 and 242 is from about 10 nm to about 40 nm. In an embodiment, the features of the photoresist layer 206 determine features of device layer 202, e.g., shallow trench isolation, gate, bitline, contact, capacitor, interconnect, and other electronic device features. Photoresist layer 206 can be any of the photoresist layers used for ArF photolithography known to one of ordinary skill in the art of electronic device manufacturing. Patterned photoresist layer 206 can be deposited on hard mask layer 205 using any of the patterning and etching techniques known to one of ordinary skill in the art of electronic device manufacturing.

Figure 2F:
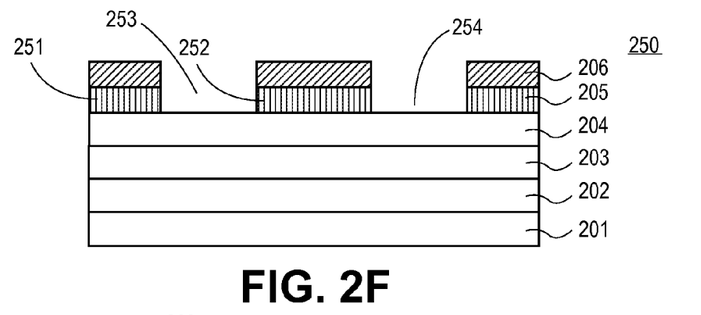
FIG. 2F is a view similar to FIG. 2E after the top hard mask layer is etched through the patterned photoresist according to one embodiment.

FIG. 2F is a view 250 similar to FIG. 2E after hard mask layer 205 is etched through patterned photoresist 206 according to one embodiment. As shown in FIG. 2F, the exposed portions 243 and 244 of the hard mask layer 205 are etched away to expose portions 253 and 254 of the mask layer 204. The portions of the hard mask layer 205 underneath the features of the photoresist 206 are left intact. The etched hard mask layer 205 comprises a plurality of features, such as a feature 251 and 252. In an embodiment, hard mask layer 205 is etched in a plasma chamber, for example in a plasma chamber depicted in FIG. 1 using one of the dry etching techniques (e.g., a reactive ion etching) known to one of ordinary skill in the art of electronic device manufacturing. In other embodiments, the hard mask layer 205 is etched using one of a wet etching, dry etching, or a combination thereof techniques known to one of ordinary skill in the art of electronic device manufacturing.

Figure 2G:
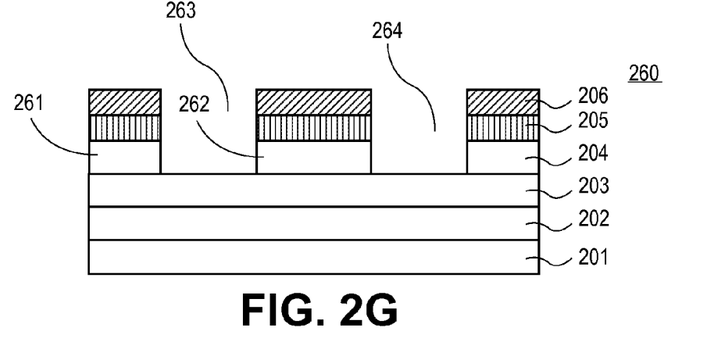
FIG. 2G is a view similar to FIG. 2F after the exposed portions of the upper hard mask layer are etched according to one embodiment.

FIG. 2G is a view 260 similar to FIG. 2F after the exposed portions of the hard mask layer 204 are etched according to one embodiment. The exposed portions 253 and 254 of the mask layer 204 are etched away to expose portions 263 and 264 of the mask layer 203. The portions of the mask layer 204 underneath the features of the hard mask layer 205 are left intact. The etched hard mask layer 204 comprises a plurality of features, such as a feature 261 and 262. In an embodiment, hard mask layer 204 is etched in a plasma system, for example the plasma system depicted in FIG. 1 using one of the dry etching techniques (e.g., a reactive ion etching) known to one of ordinary skill in the art of electronic device manufacturing. One or more parameters of the plasma system, for example, a pressure provided to the plasma chamber, a plasma source power, a bias power, a process gas flow, a process gas chemistry, a temperature, or any combination thereof are adjusted to etch the hard mask layer 204.

In an embodiment, hard mask layer 204 of amorphous carbon is etched in a plasma chamber at a pressure from about 3 mTorr to about 30 mTorr, at a source power from about 200 W to about 2000 W, at a bias power not greater than 1000 W, and at a temperature from about 0° C. to about 100° C., and in more specific embodiment, at a temperature of about 60° C. In an embodiment, hard mask layer 204 of amorphous carbon is etched using a process gas comprising oxygen, nitrogen, one or more inert gases, such as argon, helium, or any combination thereof. In an embodiment, the gas flow of each of the gases supplied to the plasma chamber to etch the hard mask layer 204 of amorphous carbon is from about 50 standard cubic centimeters per minute ("sccm") to about 1000 sccm.

Figure 2H:
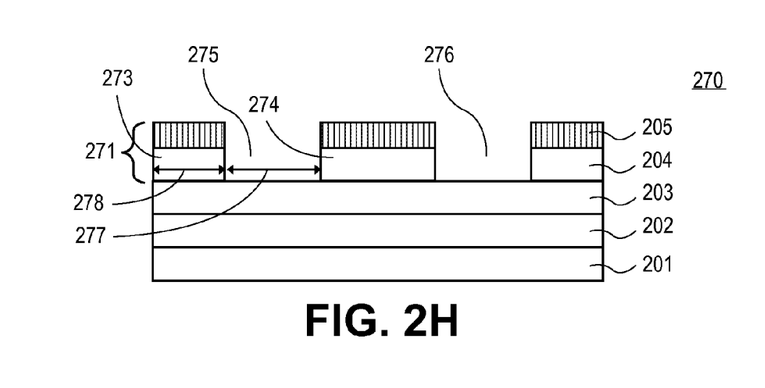
FIG. 2H is a view similar to FIG. 2G after the patterned photoresist layer is removed according to one embodiment.

FIG. 2H is a view 270 similar to FIG. 2G after the patterned photoresist layer is removed according to one embodiment. As shown in FIG. 2H, a double patterned mask 271 comprising patterned hard mask layer 205 on patterned hard mask 204 is formed on a mask layer 203. Double patterned mask 271 comprises a plurality of features, such as features 273 and 274 spaced apart from each other to expose portions of the mask layer 203, such as portions 275 an 276. In an embodiment, a distance 277 between the features 273 and 274 is from about 2 nm to about 40 nm. In an embodiment, a size 278 of the feature 273 is from about 2 nm to about 40 nm. The patterned photoresist layer can be removed from the patterned hard mask layer 205 using one of the ashing techniques known to one of ordinary skill in the art of electronic device manufacturing. In an embodiment, ashing of the patterned masking layer is performed in-situ the plasma processing chamber. For example, the patterned photoresist can be removed by a plasma ashing technique using a plasma source to generate reactive species, e.g., oxygen, fluorine, or a combination thereof. The reactive species combine with the photoresist to form ash which is removed from a plasma chamber using a vacuum pump.

Figure 2I:
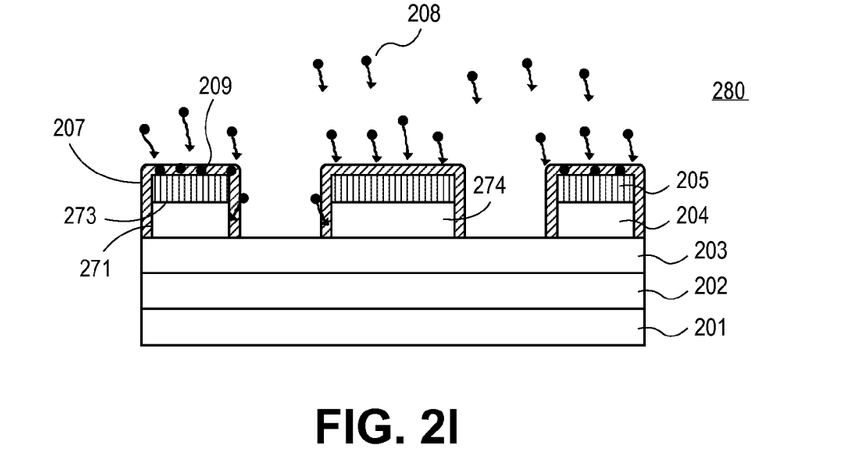
FIG. 2I is a view similar to FIG. 2H illustrating depositing a passivation layer on the patterned top hard mask layer on the upper mask layer using hydrogen plasma particles according to one embodiment.

FIG. 2I is a view 280 similar to FIG. 2H illustrating depositing a passivation layer on the patterned mask layer 271 using hydrogen plasma particles according to one embodiment. As shown in FIG. 2I the patterned mask layer 271 is subjected to a treatment by plasma comprising hydrogen plasma particles 208 that is generated from a gas comprising hydrogen. In an embodiment, the gas comprising hydrogen is $H_2$, $CH_4$, HBr, other hydrogen containing gas, or any combination thereof. The hydrogen plasma particles 208 comprise ions, electrons, radicals, or any combination thereof. The hydrogen plasma particles 208 attach to the surface of the features 274 and 274 to form a protective passivation layer 207. In an embodiment, passivation layer 207 is a polymer layer, such as a $C_xH_y$ layer formed by chemically bonding the hydrogen particles 208 to carbon of the mask layer 271.

Figure 2J:
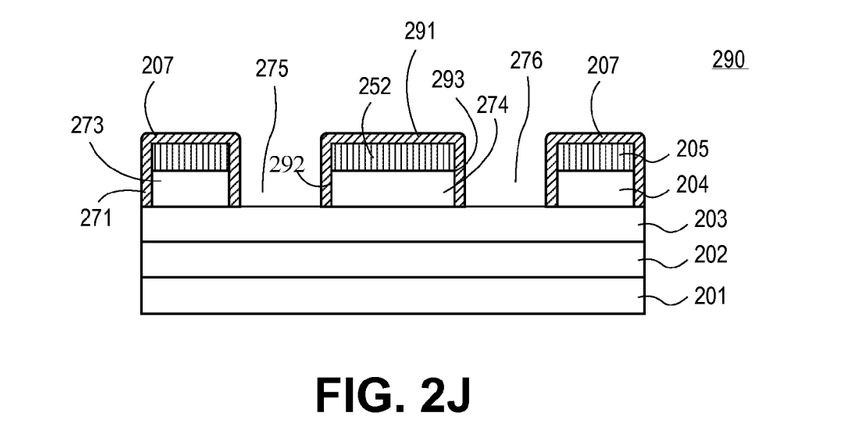
FIG. 2J is a view similar to FIG. 2I after the passivation layer is deposited on the features of the patterned top hard mask layer on the upper mask layer according to one embodiment.

FIG. 2J is a view 290 similar to FIG. 2I after the passivation layer is deposited on the features of the mask layer 271 according to one embodiment. As shown in FIG. 2J, passivation layer 207 covers all exposed surfaces of the mask features, such as top surfaces (e.g., a top surface 291) and sidewalls (e.g., a sidewall 292 and a sidewall 293) of the features of the patterned mask layer 271. In an embodiment, the passivation layer 207 is thick enough to keep the size and the shape of the features, such as features 273 and 274 of the mask layer 271 intact during etch of the underlying layers, e.g., mask layer 203 and device layer 202. In an embodiment, the thickness of the passivation layer 207 is from about 0.2 nm to about 1 nm. In more specific embodiment, the thickness of the passivation layer 207 is about 0.5 nm.

In an embodiment, the passivation layer 207 is deposited in a plasma system, for example the plasma system depicted in FIG. 1. One or more parameters of the plasma system, for example, a pressure provided to the plasma chamber, a plasma source power, a bias power, a process gas flow, a process gas chemistry, a temperature, or any combination thereof are adjusted to deposit the passivation layer 207.

In an embodiment, passivation layer 207 is deposited on the features of the mask layer 271 by plasma containing hydrogen in a plasma chamber at a pressure from about 3 mTorr to about 30 mTorr, at a source power from about 200 W to about 2000 W, at a bias power not greater than 1000 W, and at a temperature from about 0° C. to about 100° C., and in more specific embodiment, at a temperature of about 60° C. In an embodiment, the flow of the gas containing hydrogen supplied to the plasma chamber to deposit passivation layer 207 is from about 10 standard cubic centimeters per minute ("sccm") to about 1000 sccm.

Figure 2K:
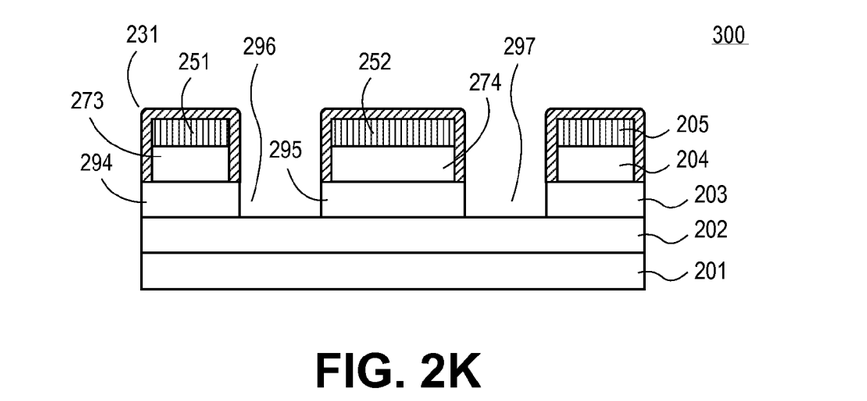
FIG. 2K is a view similar to FIG. 2J after the exposed portions of the lower mask layer are etched through the passivated patterned mask layer according to one embodiment.

FIG. 2K is a view 300 similar to FIG. 2J after the exposed portions of the mask layer 203 are etched through the passivated patterned mask layer 271 according to one embodiment. The exposed portions 275 and 276 of the mask layer 203 are etched away to expose portions 296 and 297 of the device layer 202. As shown in FIG. 2K, the size and shape of the features of the mask layer 271 covered by passivation layer 207 remain intact during etching of the mask layer 203. The portions of the mask layer 203 underneath the features of the passivated mask layer 271 are left intact. A composite mask layer 231 comprises a plurality of features, such as a feature 294 and a feature 295 to pattern features of device layer 202, such as shallow trench isolation, gate, bitline, contact, capacitor, interconnect, and other features for electronic devices.

In an embodiment, hard mask layer 203 is etched in a plasma system, for example the plasma system depicted in FIG. 1 using one of the dry etching techniques (e.g., a reactive ion etching) known to one of ordinary skill in the art of electronic device manufacturing. One or more parameters of the plasma system, for example, a pressure provided to the plasma chamber, a plasma source power, a bias power, a process gas flow, a process gas chemistry, a temperature, or any combination thereof are adjusted to etch the hard mask layer 203.

In an embodiment, hard mask layer 203 of the boron doped amorphous carbon is etched in a plasma chamber at a pressure from about 3 mTorr to about 30 mTorr, at a source power from about 200 W to about 2000 W, at a bias power not greater than 1000 W, and at a temperature from about 0° C. to about 100° C., and in more specific embodiment, at about 60° C. In an embodiment, hard mask layer 203 of the boron doped amorphous carbon is etched using a process gas comprising fluorine (e.g., sulfur hexafluoride $SF_6$, nitride trifluoride $NF_3$), chlorine ($Cl_2$), methane ("$CH_4$"), oxygen, or any combination thereof. In an embodiment, the gas flow of each of the gases supplied to the plasma chamber to etch the hard mask layer 204 of amorphous carbon is from about 100 standard cubic centimeters per minute ("sccm") to about 1000 sccm.

In more specific embodiment, hard mask layer 203 of the boron doped amorphous carbon is etched using plasma generated from a process gas comprising $CH_4$, $Cl_2$, $SF_6$, $NF_3$, $O_2$, or any combination thereof. In one embodiment, the gas flow of $Cl_2$ supplied to the plasma processing chamber to etch hard mask layer 203 is from about 140 to about 900 sccm/m2 of the substrate plan area. In one embodiment, the gas flow of $CH_4$ supplied to the plasma processing chamber to etch hard mask layer 203 is from about 70 and about 425 sccm/m2 of substrate plan area. In one embodiment, the gas flow of $SF_6$ supplied to the plasma processing chamber to etch hard mask layer 203 is from about 70 to about 425 sccm/m2 of substrate plan area. In one embodiment, the gas flow of $O_2$ supplied to the plasma processing chamber to etch hard mask layer 203 is from about 280 and about 1130 sccm/m2 of substrate plan area. In one embodiment, the RF power supplied to one or more coils inductively coupled to the plasma in the plasma processing chamber to etch hard mask layer 203 is from about 300 Watts to about 1750 Watts. In one embodiment, the bias power supplied to the pedestal in the plasma processing chamber to etch hard mask layer 203 is from about 100 Watts to about 700 Watts.

Figure 2L:
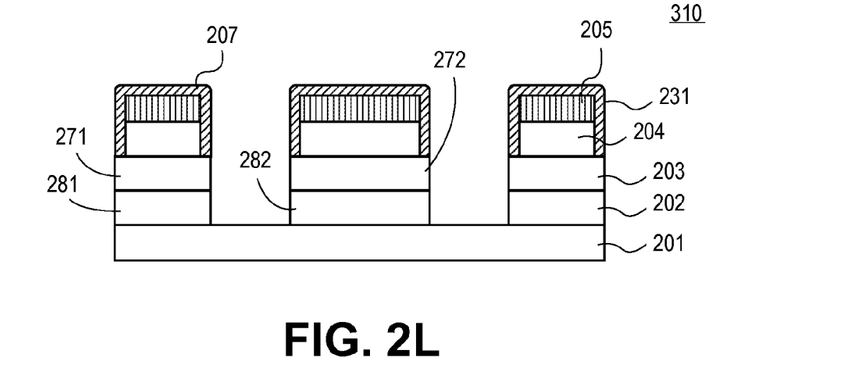
FIG. 2L is a view similar to FIG. 2K, after the exposed portions of the device layer are etched through a patterned composite mask layer according to one embodiment.

FIG. 2L is a view 310 similar to FIG. 2K, after the exposed portions of the device layer 202 are etched through a patterned composite mask layer 231 according to one embodiment. As shown in FIG. 2L, the size and shape of the features of the composite mask layer 231 remain intact during etching of the device layer 202. The portions of the device layer 202 underneath the features of the composite mask layer 231 are left intact. In an embodiment, device layer 202 is etched in a plasma system, for example the plasma system depicted in FIG. 1 using one of the dry etching techniques (e.g., a reactive ion etching) known to one of ordinary skill in the art of electronic device manufacturing. One or more parameters of the plasma system, for example, a pressure provided to the plasma chamber, a plasma source power, a bias power, a process gas flow, a process gas chemistry, a temperature, or any combination thereof are adjusted to etch the device layer 202.

Figure 2M:
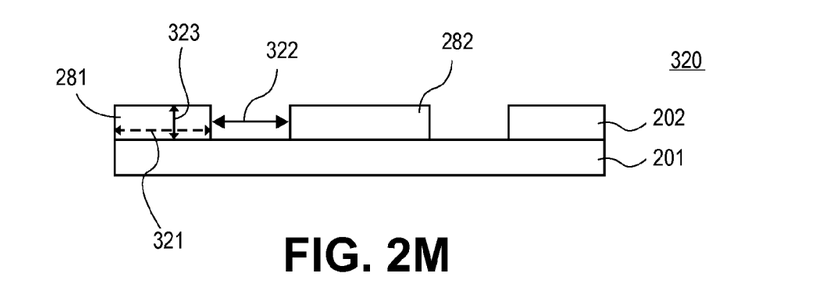
FIG. 2M is a view similar to FIG. 2L after the composite mask layer is removed according to one embodiment.

FIG. 2M is a view 320 similar to FIG. 2L after the composite mask layer 231 is removed according to one embodiment. As shown in FIG. 2M, device layer 202 comprises a plurality of features, such as a feature 281 and a feature 282. Features 281 and 282 have critical dimensions, such as a height 323, a width 321 of the feature 281 and a distance 322 between the features 281 and 282. In an embodiment, the features of the device layer 202 have the aspect ratio of the height to the width greater than 10:1. In various embodiments, features 281 and 282 are shallow trench isolation, gate, bitline, contact, capacitor, interconnect, or other electronic device features. As shown in FIG. 2M, a width 321 of the feature 281 of the device layer 202 corresponds to the width of the feature 294 of the composite mask layer 231. A distance 322 between features 281 and 282 of the device layer 202 corresponds to the distance between the features of the composite mask layer. In an embodiment, width 321 of the feature 281 is substantially the same along height 323. In an embodiment, height 323 of the feature 281 is substantially the same along width 321.

The patterned composite mask layer can be removed from the device layer 202 using one of the ashing techniques known to one of ordinary skill in the art of electronic device manufacturing. In an embodiment, ashing of the patterned masking layer is performed in-situ the plasma processing chamber. For example, the patterned mask can be removed by a plasma ashing technique using a plasma source to generate reactive species, e.g., oxygen, fluorine, or a combination thereof. The reactive species combine with the patterned mask to form ash which is removed from a plasma chamber using a vacuum pump.

Figure 3:
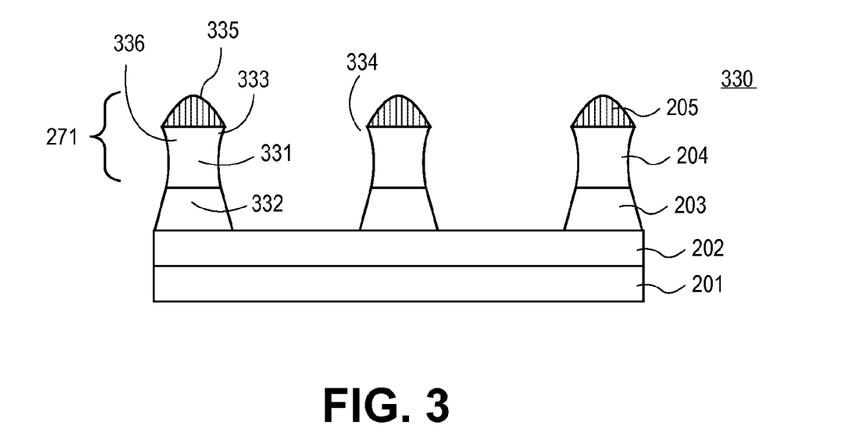
FIG. 3 is a view similar to FIG. 2H, after the exposed portions of the mask layer are etched through the patterned mask layer without a prior passivation operation of the patterned mask layer by hydrogen plasma particles according to one embodiment.

FIG. 3 is a view 330 similar to FIG. 2H, after the exposed portions of the mask layer 203 are etched through patterned mask layer 271 without a prior passivation operation of the patterned mask layer 271 by hydrogen plasma particles according to one embodiment. In an embodiment, hard mask layer 203 is etched through unpassivated mask layer 271 using one of techniques described above with respect to FIG. 2K. Unlike the features of the mask layer 271 shown in FIG. 2L, the features of the mask layer 271 shown in FIG. 3 are not treated by the hydrogen plasma particles. The untreated features of the mask layer 271 are deteriorated during etching of the mask layer 203. The mask layer 271 has a plurality of features, such as a feature 333 and a feature 334. The size and shape of the features of the mask layer 271 are changed by ion bombardment during plasma etching of the underlying mask layer 203. As shown in FIG. 3, feature 333 has a necking portion 331 the width of which is smaller than the widths of an upper portion 336 and a lower portion 332. The necking of the features can cause the mask feature collapse. Top portions of the features of the hard mask layer 271, such as a top portion 335 have a rounded shape, as shown in FIG. 3. As shown in FIG. 3, etching of the underlying layer 203 deteriorates the selectivity of the unpassivated mask layer 271. The features of the mask layer 271 are not preserved during the etching of the underlying layer 203. In contrast, passivation of the mask 271 using plasma comprising hydrogen particles advantageously increases selectivity of the mask while providing highly anisotropic etching of the underlying layers, as depicted in FIG. 2L. Prior passivation of the mask features by hydrogen plasma particles provides a benefit of decreasing the CD of the etched features without pattern collapse.

Figure 4:
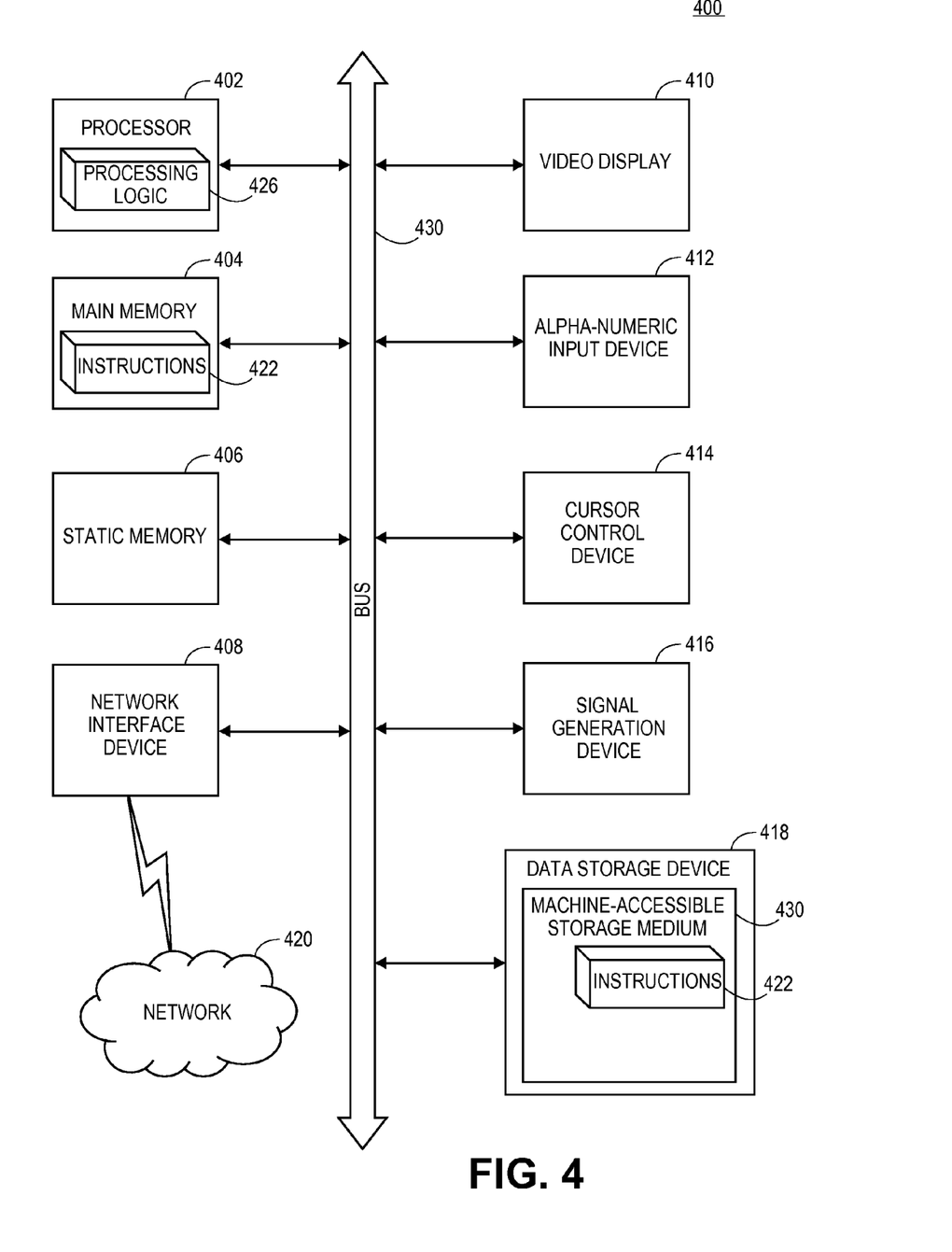
FIG. 4 shows a block diagram of an embodiment of a data processing system to control the plasma system to provide mask passivation as described herein.

FIG. 4 shows a block diagram of an embodiment of a data processing system 400 to control the plasma system to provide mask passivation as described herein. Data processing system 400 can represent control system 117. In at least some embodiments, the data processing system controls the plasma system to perform operations involving supplying a gas comprising hydrogen to a plasma source; generating plasma comprising hydrogen plasma particles from the gas; and depositing a passivation layer on a first mask layer on a second mask layer over a substrate using the hydrogen plasma particles, as described herein.

In alternative embodiments, the data processing system may be connected (e.g., networked) to other machines in a Local Area Network (LAN), an intranet, an extranet, or the Internet. The data processing system may operate in the capacity of a server or a client machine in a client-server network environment, or as a peer machine in a peer-to-peer (or distributed) network environment.

The data processing system may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that data processing system. Further, while only a single data processing system is illustrated, the term "data processing system" shall also be taken to include any collection of data processing systems that individually or jointly execute a set (or multiple sets) of instructions to perform any one or more of the methodologies described herein.

The exemplary data processing system 400 includes a processor 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a secondary memory 418 (e.g., a data storage device), which communicate with each other via a bus 430.

Processor 402 represents one or more general-purpose processing devices such as a microprocessor, central processing unit, or the like. More particularly, the processor 402 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 402 may also be one or more special-purpose processing devices such as an application specific integrated circuit (ASIC), a field programmable gate array (FPGA), a digital signal processor (DSP), network processor, or the like. Processor 402 is configured to execute the processing logic 426 for performing the operations described herein.

The computer system 400 may further include a network interface device 408. The computer system 400 also may include a video display unit 410 (e.g., a liquid crystal display (LCD), a light emitting diode display (LED), a cathode ray tube (CRT), etc.), an alphanumeric input device 412 (e.g., a keyboard), a cursor control device 414 (e.g., a mouse), and a signal generation device 416 (e.g., a speaker).

The secondary memory 418 may include a machine-accessible storage medium (or more specifically a computer-readable storage medium) 430 on which is stored one or more sets of instructions (e.g., software 422) embodying any one or more of the methodologies or functions described herein. The software 422 may also reside, completely or at least partially, within the main memory 404 and/or within the processor 402 during execution thereof by the computer system 400, the main memory 404 and the processor 402 also constituting machine-readable storage media. The software 422 may further be transmitted or received over a network 420 via the network interface device 408.

While the machine-accessible storage medium 430 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In the foregoing specification, embodiments of the invention have been described with reference to specific exemplary embodiments thereof. It will be evident that various modifications may be made thereto without departing from the broader spirit and scope of embodiments of the invention as set forth in the following claims. The specification and drawings are, accordingly, to be regarded in an illustrative sense rather than a restrictive sense.

What is claimed is:

1. A method to provide a mask comprising:
supplying a gas comprising hydrogen to a plasma source;
generating plasma comprising hydrogen plasma particles from the gas; and
depositing a passivation layer on a first mask layer on a second mask layer over a substrate using the hydrogen plasma particles, wherein the first mask layer comprises a first amorphous carbon layer, and wherein the second mask layer comprises a boron doped amorphous carbon layer.

2. The method of claim 1, wherein the passivation layer comprises a polymer layer formed by bonding the hydrogen particles to the first mask layer.

3. The method of claim 1, wherein the gas comprising hydrogen is $H_2$, $CH_4$, HBr, other hydrogen containing gas, or any combination thereof.

4. The method of claim 1, further comprising
depositing the first amorphous carbon layer on the second mask layer;
depositing a hard mask layer on the first amorphous carbon layer;
patterning the hard mask layer; and
patterning the first amorphous carbon layer to form the first mask layer.

5. The method of claim 1, further comprising
etching the second mask layer through the passivated first mask layer.

6. The method of claim 1, wherein depositing the passivation layer comprises
adjusting at least one of a first pressure, a first source power, a first bias power, a first gas flow, or a first temperature.

7. A method to manufacture an electronic device comprising:
depositing a passivation layer on a first mask layer on a boron doped carbon layer over a substrate using plasma comprising hydrogen plasma particles; and
etching the boron doped carbon layer through the passivated first mask layer, wherein the first mask layer comprises a hard mask layer on a first amorphous carbon layer.

8. The method of claim 7, wherein the passivation layer comprises a polymer layer formed by bonding the hydrogen particles to carbon of the first mask layer.

9. The method of claim 7, wherein the plasma is generated using a gas comprising $H_2$, $CH_4$, HBr, other hydrogen containing gas, or any combination thereof.

10. The method of claim 7, wherein the boron doped carbon layer through the passivated first mask layer is etched using plasma comprising a fluorine chemistry, a chlorine chemistry, or a combination thereof chemistries.

11. The method of claim 7, wherein depositing the passivation layer comprises
adjusting at least one of a first pressure, a first source power, a first bias power, a first gas flow, or a first temperature.

12. The method of claim 7, wherein etching the boron doped carbon layer comprises adjusting at least one of a second pressure, a second source power, a second bias power, a second gas flow, or a second temperature.

* * * * *